(12) United States Patent
Rothfuss et al.

(10) Patent No.: US 9,230,797 B2
(45) Date of Patent: Jan. 5, 2016

(54) DIELECTRIC AND/OR CAPACITOR FORMATION

(75) Inventors: Chris Rothfuss, Laramie, WY (US);
Sung-Wei Chen, Las Vegas, NV (US)

(73) Assignee: Empire Technology Development LLC, Wilmington, DE (US)

( * ) Notice: Subject to any disclaimer, the term of this patent is extended or adjusted under 35 U.S.C. 154(b) by 562 days.

(21) Appl. No.: 13/391,038

(22) PCT Filed: May 26, 2011

(86) PCT No.: PCT/US2011/038046
§ 371 (c)(1),
(2), (4) Date: Feb. 17, 2012

(87) PCT Pub. No.: WO2012/161714
PCT Pub. Date: Nov. 29, 2012

(65) Prior Publication Data
US 2012/0301735 A1 Nov. 29, 2012

(51) Int. Cl.
*H01G 9/07* (2006.01)
*H01G 9/15* (2006.01)
*B32B 9/04* (2006.01)
(Continued)

(52) U.S. Cl.
CPC ........ *H01L 21/02175* (2013.01); *H01G 4/1272* (2013.01); *H01G 4/33* (2013.01); *H01L 21/022* (2013.01); *H01L 28/40* (2013.01);
(Continued)

(58) Field of Classification Search
CPC ........... H01G 9/07; H01G 4/1272; B32B 9/04
USPC .................................................... 427/130, 79
See application file for complete search history.

(56) References Cited

U.S. PATENT DOCUMENTS 4,101,907 A * 7/1978 Bell et al. .................... 369/275.5
4,461,807 A * 7/1984 Mori et al. ...................... 428/469
(Continued)

FOREIGN PATENT DOCUMENTS

EP 2178122 4/2010

OTHER PUBLICATIONS

Singh et al. "Characterization of evaporated tellurium oxide films", Journal of Materials Science (1984), 19: 3844-3848.
(Continued)

*Primary Examiner* — Katherine A Bareford
*Assistant Examiner* — Christina McClure
(74) *Attorney, Agent, or Firm* — Morritt Hock & Hamroff LLP; Steven S. Rubin, Esq.

(57) ABSTRACT

Technologies are generally described for a component, a method to form a component and/or a system configured to form a component. In an example, the method to form a component may include placing a first layer including a conductive material on a support. The method may include placing a second layer, including the conductive material and oxygen, on the first layer. The method may include placing a third layer, including tellurium and oxygen, on the second layer. The method may include placing a fourth layer, including tin and tellurium, on the third layer. In an example, placing of the fourth layer on the third layer may include placing a fifth layer including tellurium on the fourth layer, placing a sixth layer including tin on the fifth layer, placing a seventh layer including tellurium on the sixth layer and annealing the fifth, sixth, and seventh layers to form the fourth layer.

16 Claims, 4 Drawing Sheets

(51) Int. Cl.
- *B32B 15/04* (2006.01)
- *H01L 21/02* (2006.01)
- *H01G 4/33* (2006.01)
- *H01G 4/12* (2006.01)
- *H01L 49/02* (2006.01)
- *H01G 4/30* (2006.01)

(52) U.S. Cl.
CPC ............... *H01L 28/60* (2013.01); *H01G 4/304* (2013.01); *H01L 21/02244* (2013.01)

(56) References Cited

U.S. PATENT DOCUMENTS

| | | | |
|---|---|---|---|
| 4,954,379 A * | 9/1990 | Nishida et al. | 428/64.6 |
| 5,346,740 A * | 9/1994 | Ohno et al. | 428/64.5 |
| 5,348,783 A * | 9/1994 | Ohno et al. | 428/64.5 |
| 5,486,277 A | 1/1996 | Barbee, Jr. et al. | |
| 5,742,471 A | 4/1998 | Barbee, Jr. et al. | |
| 2007/0105285 A1 | 5/2007 | Kusumoto et al. | |
| 2009/0085095 A1* | 4/2009 | Kamath et al. | 257/321 |
| 2009/0163647 A1 | 6/2009 | DeLuca et al. | |
| 2013/0071988 A1* | 3/2013 | Deweerd et al. | 438/396 |

OTHER PUBLICATIONS

Rogacheva et al. "Oscillations in the thickness dependences of the room-temperature Seebeck coefficient in SnTe thin films"; Thin Solid Films (2005), 484: 433-437.

Burstein et al. "The Dielectric Properties of the Cubic IV-VI Compound Semiconductors"; Le Journal De Physique Colloques (1968), 29(C4): 78-83.

Liu et al. "Thermodynamic Descriptions for the Sn—Te and Pb—Sn—Te Systems"; Journal of Electronic Materials (2010), 39(2): 246-257.

Gelbstein "Thermoelectric power and structural properties in two-phase Sn/SnTe alloys"; Journal of Applied Physics (2009), 105: 023713-1-023713-5.

Motiejunas et al. "Correlation between the mössbauer and semiconductor parameters of tin tellurides"; phys. stat. sol. (Institute of Physics, Academy of Sciences of the Lithuanian SSR, Vilnius1) (b) 154 (1989) p. 341-345.

Patent Cooperation Treaty, International Search Report, PCT/US2011/038046, Form PCT/ISA/220, filing date May 26, 2011.

Patent Cooperation Treaty, Written Opinion, PCT/US2011/038046, Form PCT/ISA/237, filing date May 26, 2011.

\* cited by examiner

DIELECTRIC AND/OR CAPACITOR FORMATION

CROSS REFERENCE TO RELATED APPLICATIONS

This application is a U.S. National Stage filing under 35 U.S.C. §371 of International Application No. PCT/US2011/038046 filed on May 26, 2011, the entirety of which is hereby incorporated by reference.

BACKGROUND

Unless otherwise indicated herein, the materials described in this section are not prior art to the claims in this application and are not admitted to be prior art by inclusion in this section.

A capacitor may include two or more electrodes separated by a distance and/or separated by a separator or dielectric material. A super or ultra-capacitor may include two or more electrodes separated by an electrolyte. In examples when a voltage is applied across the two electrodes, a positively charged electrode and a negatively charged electrode may be formed. Positively charged ions in the electrolyte may tend to move toward the negatively charged electrode forming a first capacitor. Negatively charged ions in the electrolyte may tend to move toward the positively charged electrode forming a second capacitor in series with the first capacitor. The first and second capacitors in series may function as a single super or ultra-capacitor.

SUMMARY

In some examples, a method of forming a component is generally described. The method may include placing a first layer on a support. The first layer may include tellurium and oxygen. The method may include placing a second layer on the first layer. The second layer may include tin and tellurium.

In some examples, a system for forming a component is generally described. The system may include a chamber, a heater in communication with the chamber, a deposition device and/or a processor. The deposition device may be in communication with the chamber. The processor may be in communication with the chamber, the heater and the deposition device. The processor may be arranged to control the chamber, heater and deposition device to place a first layer on a support. The first layer may include tellurium and oxygen. The processor may be arranged to control the chamber, heater and deposition device to place a second layer on the first layer. The second layer may include tin and tellurium.

In some examples, a component is generally described. The component may include a first layer including tellurium and oxygen. The component may include a second layer on the first layer. The second layer may include tin and tellurium.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

Figure 1:
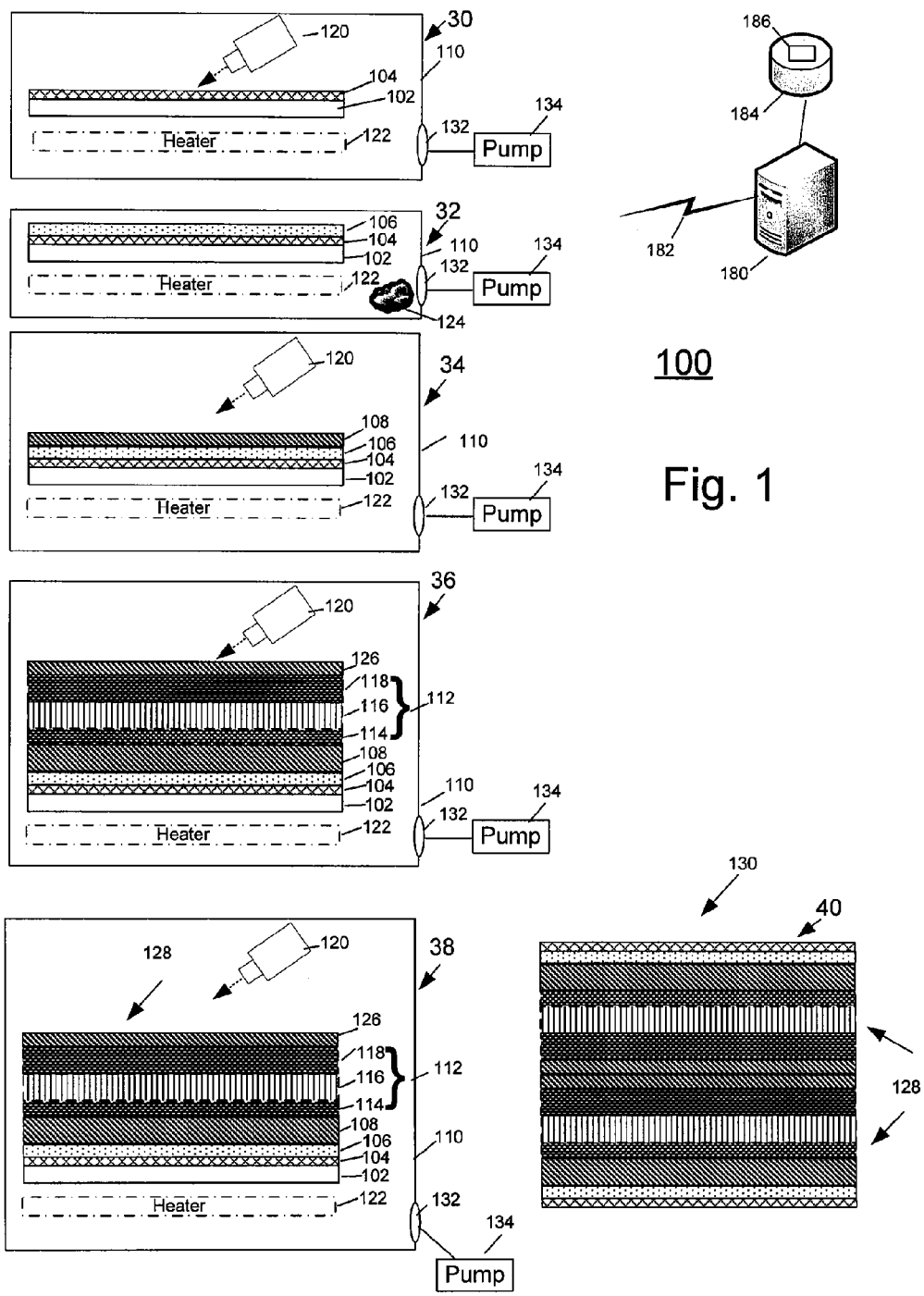
FIG. 1 illustrates an example system that can be utilized to implement dielectric and/or capacitor formation.

all arranged according to at least some embodiments described herein.

DETAILED DESCRIPTION

In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to systems, methods, materials and apparatus related to dielectric and/or capacitor formation.

Briefly stated, technologies are generally described for a component, a method to form a component and/or a system configured to form a component. In an example, the method to form a component may include placing a first layer including a conductive material on a support. The method may include placing a second layer, including the conductive material and oxygen, on the first layer. The method may include placing a third layer, including tellurium and oxygen, on the second layer. The method may include placing a fourth layer, including tin and tellurium, on the third layer. In an example, placing of the fourth layer on the third layer may include placing a fifth layer including tellurium on the fourth layer, placing a sixth layer including tin on the fifth layer, placing an seventh layer including tellurium on the sixth layer and annealing the fifth, sixth, and seventh layers to form the fourth layer.

It will also be understood that any compound, material or substance which is expressly or implicitly disclosed in the specification and/or recited in a claim as belonging to a group or structurally, compositionally and/or functionally related compounds, materials or substances, includes individual representatives of the group and all combinations thereof.

FIG. 1 illustrates an example system that can be utilized to implement dielectric and/or capacitor formation in accordance with at least some embodiments described herein. An example component or dielectric and/or capacitor formation system 100 may include one or more of a chamber 110, a deposition device 120, a pump 134 and/or a heater 122. Heater 122 may be effective to control a temperature near heater 122 and may include a heating element and/or a cooling element. Chamber 110 may include a port 132. At least some of these elements may be arranged in communication with a processor 180 through a communication link 182. In some examples, processor 180 may be adapted in communication with a memory 184 that may include instructions 186 stored therein. Processor 180 may be configured, such as by instructions 186, to control at least some of the operations/actions/functions described below. Deposition device 120 may use any type of deposition such as chemical vapor deposition, physical vapor deposition, electrochemical wet chemistry, lithography, spin coating, sputtering, etc.

In an example, as shown at 30, a conductive substrate 104, such as aluminum, may be placed on a support 102 such as by evaporation using an electron beam physical vapor deposition device 120. In an example, substrate 104 may be deposited on support 102 at a rate of about 10 nm/second for a time interval of about 10 seconds. In another example, substrate 104 may be deposited on support 102 at a rate of 25 nm/s for a time interval of about 4 seconds. As an example, other deposition rates and/or times may be used to produce a 100 nm deposition. In some examples, any conductive metal or semiconductor may be used for substrate 104.

As shown at 32, substrate 104 may be oxidized to form an $Al_2O_3$ layer 106. In an example, substrate 104 may be heated by heating device 122, such as through infrared heat, at a temperature of about 250 degrees Celsius to about 1000 degrees Celsius in an atmosphere of a range of about $10^{-4}$ Torr to about $10^{-9}$ Torr or lower pressure Oxygen 124 for a time interval of about 1 second to about 50 seconds to form $Al_2O_3$ layer 106. Substrate 104 and/or $Al_2O_3$ layer 106 may form an electrode for a formed capacitor 130 discussed in more detail below.

As shown at 34, a layer 108, including tellurium and oxygen, such as $Te_2O_5$, $TeO_2$, or $TeO_3$, may be placed on layer 106. In an example, chamber 110 may be evacuated from oxygen 124 and an atmosphere of a vacuum of about $10^{-5}$ Torr or lower pressure may be applied, such as through port 132 and pump 134. A temperature of substrate 104 may be lowered to a temperature in a range of about 10 degrees Celsius to about 30 degrees Celsius under control of heater 122. Tellurium dioxide $TeO_2$ may be evaporated on to layer 106 using electron beam physical vapor deposition by deposition device 120. In an example, $TeO_2$ may be deposited at a rate of about 1 nm/second for a time interval of about 10 seconds to form layer 108 including tellurium and oxygen. In an example, any other deposition rate and time interval may be used to produce a desired thickness of, for example, about 10 nm. In an example, a layer with a thickness in a range of about 5 nm to about 10 nm of $Te_2O_5$ may be deposited on layer 106 including $Al_2O_3$.

As shown at 36, a layer 112 including tin (Sn) and tellurium (Te), such as a polycrystalline SnTe, may be placed on layer 108. In an example, an atmosphere of chamber 110 may be evacuated and an atmosphere of a vacuum of about $10^{-6}$ Torr or lower pressure may be generated inside chamber such as through port 132 and pump 134. Heater 122 may be controlled to cool substrate 104 to about 10 degrees Celsius to about 25 degrees Celsius. To place layer 112, a layer 114 including tellurium may be epitaxially grown on layer 108, such as by chemical vapor deposition using deposition device 120. In an example, layer 114 including tellurium may be grown at a rate of about 0.5 nm per second for a time interval of about 10 seconds to form about a 5 nm to about a 7 nm thick layer 114. In an example, any other deposition rate and time interval may be used to produce a desired thickness of, for example, about 5 nm. In an example, a thickness of layer 114 may be chosen so that the tellurium may stoichiometrically complement the tin in layer 112.

A layer 116 including tin may be placed on layer 114 including tellurium using an electron beam deposition device 120. In an example, layer 116 including tin may be deposited at a rate of about 0.5 nm/second for about 17 seconds to produce about a 7 nm to about a 9 nm thick layer 116. In an example, any other deposition rate and time interval may be used to produce a desired thickness of, for example, about 7 nm to about 9 nm. A layer 118 including tellurium may be epitaxially grown on layer 116 such as by chemical vapor deposition using deposition device 120. In an example, layer 118 may be grown at a rate of about 0.5 nm per second for a time interval of about 12 seconds to form about a 5 nm to about a 7 nm thick layer 118. In an example, any other deposition rate and time interval may be used to produce a desired thickness of, for example, about 7 nm. Layers 114, 116 and 118 may be annealed, such as by being heated by heater 122 at a temperature of a range of about 300 degrees Celsius to about 400 degrees Celsius for a time interval of about 2 hours to about 5 hours to form layer 112. In an example, layer 112 may be about 1 nm thick to about 50 nm thick. In an example, layer 112 may be about 15 nm thick to about 25 nm thick. A layer 126 including tellurium and oxygen, such as $Te_2O_5$, may also be formed by annealing layers 114, 116 and 118.

As shown at 38, a layer 126 including tellurium and oxygen, such as $Te_2O_5$, may be placed on layer 112. In an example, layer 126 may be formed, at least in part, during the process described above at 36. Placing layer 126 on layer 112 may form a wafer 128. To form layer 126, chamber 110 may be evacuated from oxygen 124 and an atmosphere of $10^{-6}$ Torr or lower pressure may be applied, such as through port 132 and pump 134. A temperature of substrate 104 may be lowered to a temperature in a range of about 10 degrees Celsius to about 30 degrees Celsius under control of heater 122. Tellurium dioxide $TeO_2$ may be evaporated on to SnTe layer 112 using electron beam physical vapor deposition such as by deposition device 120. In an example, $TeO_2$ may be deposited at a rate of about 1 nm/second for a time interval of about 5 seconds to form $Te_2O_5$. In an example, any other deposition rate and time interval may be used to produce a desired thickness of, for example, about 5 nm.

In an example, about 5 nm of $Te_2O_5$ may be deposited on a 20 nm SnTe layer 112. In an example, layers 108 and 126 including tellurium and oxygen may each be between about 1 nm thick and about 10 nm thick. In an example, layers 108 and 126 including tellurium and oxygen, may each be between about 3 nm and about 7 nm thick. In an example, where layer 112 including SnTe is about 20 nm thick and layers 108 and 118 including tellurium and oxygen are each about 5 nm thick, a permittivity $\epsilon r$ of 1770, a breakdown field strength of 4.6 MV/cm and/or an energy density of 58.5 Wh/kg of wafer 128 may be formed.

The process shown at 34, 36 and 38 may be repeated a desired number of times for a desired number of layers. For example, the process shown at 36 and 38 may be repeated 50 times. The process shown at 30, 32, 34, 36, and 38 may be repeated to make two wafers 128. As shown at 40, two wafers 128 may be placed on one another, and supports 102 may be removed to form a capacitor 130.

Among other benefits, a system arranged in accordance with the present disclosure may be used to form a dielectric and/or a capacitor with a relatively high dielectric constant, a relatively high breakdown capacity, and/or a relatively high energy storage capacity. A formed capacitor may be placed on a curved surface to form a curved capacitor. As tellurium continuity may be maintained through a formed dielectric, increased breakdown field strength may be realized.

In an example, an energy storage equation for a parallel plate capacitor may be $$E = \tfrac{1}{2} C V^2. \quad (EQ. 1)$$

The maximum energy may be at a breakdown field (Vmax) which may be determined as:

$$V\text{max} = Fb * d \quad (EQ. 2)$$

where Fb is the breakdown field and d is the distance between the parallel plate electrodes. The capacitance (C) for linear dielectrics can be determined as:

$$C = (A/d) * \epsilon 0 * \epsilon r \quad (EQ. 3)$$

where A is the electrode area, d is the distance between the electrodes, $\epsilon 0$ is the permittivity of free space and cr is the relative permittivity. The electric field can be determined as:

$$E = \tfrac{1}{2} A/d * \epsilon 0 * \epsilon r F b^2 \quad (EQ. 4.1)$$

Dividing by Ad to get energy per unit volume, we get $$E/(Ad) = \tfrac{1}{2} \epsilon 0 * \epsilon r F b^2 \quad (EQ. 4.2)$$

In an example structure that is arranged in accordance with various aspects of the present disclosure, $\epsilon r = 1416$ and $Fb = 4.60$ MV/cm. Substituting into EQ. 4.2 and solving yields:

$$E/(Ad) = \tfrac{1}{2} (8.854 \times 10^{-14} \text{ F/cm}) * (1416) * (4.60 \times 10^6 \text{ V/cm})^2$$

$$E/(Ad) = 1326.44 \text{ J/cm}^3 = 1.326 \text{ kJ/cm}^3$$

Figure 2:
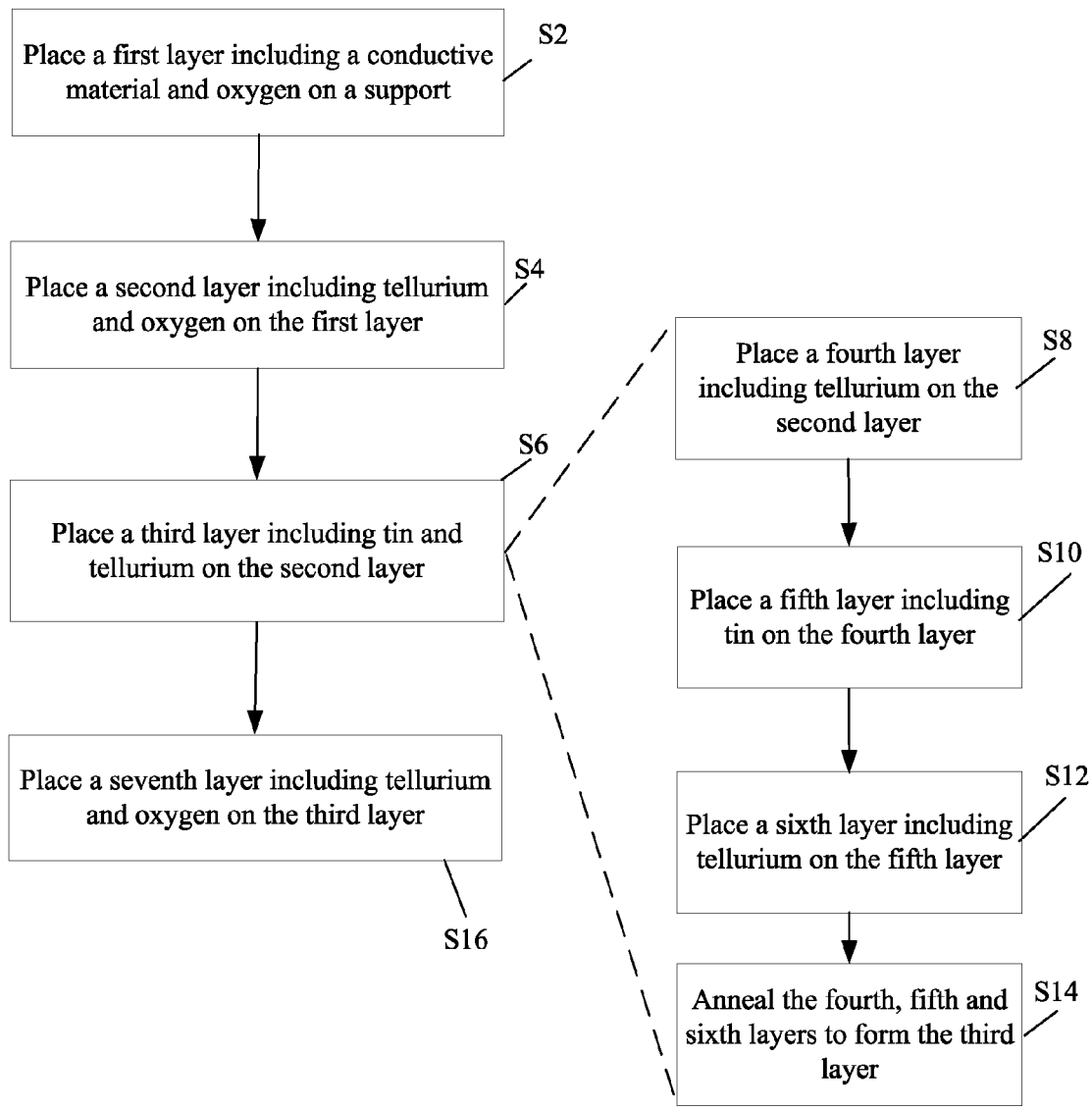
FIG. 2 depicts a flow diagram for an example process for implementing dielectric and/or a capacitor formation.

In this example, there was about 80% SnTe and 20% $Te_2O_5$ by volume. SnTe density was taken as 6.445 g/cm$^3$. $Te_2O_5$ density was taken as 5.7 g/cm$^3$. Based on the volume fraction that gives an overall density of 6.296 g/cm$^3$. Dividing 1326.44 J/cm$^3$ by 6.296 g/cm$^3$ gives:

E/mass=210.68 W/g=210.68 kJ/kg*1 Wh/3.6 kJ=58.5 Wh/kg. FIG. 2 depicts a flow diagram for an example process 200 for forming a dielectric and/or a capacitor in accordance with at least some embodiments described herein. The process in FIG. 2 could be implemented using, for example, system 100 discussed above. An example process may include one or more operations, actions, or functions as illustrated by one or more of blocks S2, S4, S6, S8, S10, S12, S14 and/or S16. Although illustrated as discrete blocks, various blocks may be divided into additional blocks, combined into fewer blocks, or eliminated, depending on the desired implementation.

Process 200 may begin at block S2, "Place a first layer including a conductive material and oxygen on a support." At block S2, a first layer including a conductive material and oxygen may be placed on a support. For example, a processor may be configured to control placement of conductive material such as aluminum on a support. In an example, the conductive material may be deposited on the support using a deposition device such as an electron beam physical vapor deposition device. In an example, aluminum may be placed on the support and the aluminum may be oxidized such as by heating the support to about 500 degrees Celsius in an oxygen atmosphere to form a layer of $Al_2O_3$.

Processing may continue from block S2 to block S4, "Place a second layer including tellurium and oxygen on the first layer." At block S4, a second layer including tellurium and oxygen may be placed on the first layer. In an example, the processor may be configured to control placement of a layer including tellurium and oxygen on the first layer such as by control of a deposition device. In an example, tellurium dioxide may be evaporated on the first layer using electron beam physical vapor deposition.

Processing may continue from block S4 to block S6, "Place a third layer including tin and tellurium on the second layer." At block S6, a third layer including tin and tellurium may be placed on the second layer such as through the use of a deposition device. In an example, the processor may be configured to control placement of a layer including tin and tellurium on the second layer such as by a deposition device. Block S6 may be performed through the process shown in blocks S8, S10, S12 and/or S14.

At block S8, "Place a fourth layer including tellurium on the second layer," the process may include placing a fourth layer including tellurium on the second layer. For example, a layer including tellurium may be epitaxially grown on the second layer such as by chemical vapor deposition. In an example, the processor may be configured to control placement of a layer including tellurium on the second layer such as by a deposition device.

Processing may continue from block S8 to block S10, "Place a fifth layer including tin on the fourth layer." At block S10, a fifth layer including tin may be placed on the fourth layer. In an example, the fifth layer may be deposited on the fourth layer using electron beam deposition. In an example, the processor may be configured to control placement of a layer including tin on the fifth layer such as by a deposition device.

Processing may continue from block S10 to block S12, "Place a sixth layer including tellurium on the fifth layer." At block S12, a sixth layer including tellurium may be placed on the fifth layer. For example, a layer including tellurium may be epitaxially grown on the fifth layer such as by chemical vapor deposition. In an example, the processor may be configured to control placement of a layer including tellurium on the fifth layer such as by a deposition device.

Processing may continue from block S12 to block S14, "Anneal the fourth, fifth and sixth layers to form the third layer." At block S14, the fourth, fifth and sixth layers may be annealed. For example, the fourth, fifth and sixth layers may be heated to a temperature in a range of about 300 degrees Celsius to about 400 degrees Celsius. In an example, the processor may be configured to anneal the fourth, fifth and sixth layers such as by controlling a heater.

Processing may continue from block S6 to block S16, "Place a seventh layer including tellurium and oxygen on the third layer." At block S16, a seventh layer including tellurium and oxygen may be placed on the third layer. In an example, the seventh layer may be formed during block S6. In an example, the seventh layer may be evaporated on the third layer using electron beam physical vapor deposition. For example, the processor may be configured to control placement of a layer including tellurium and oxygen on the third layer such as by a deposition device.

Figure 3:
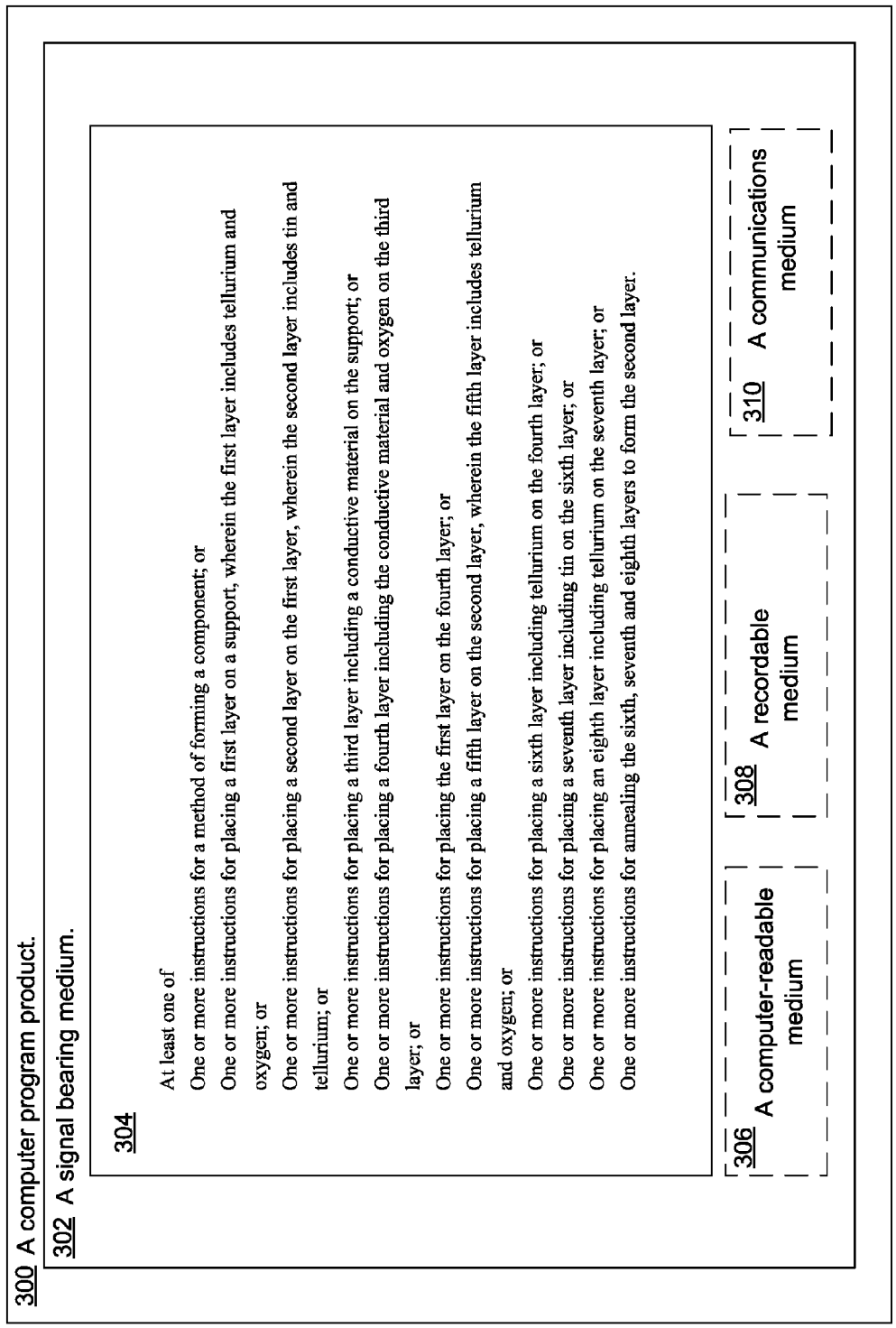
FIG. 3 illustrates a computer program product that can be utilized to implement dielectric and/or capacitor formation.

FIG. 3 illustrates a computer program product that can be utilized to implement dielectric and/or capacitor formation in accordance with at least some embodiments described herein. Program product 300 may include a signal bearing medium 302. Signal bearing medium 302 may include one or more instructions 304 that, when executed by, for example, a processor, may provide the functionality described above with respect to FIGS. 1-2. Thus, for example, referring to system 100, processor 180 may undertake one or more of the blocks shown in FIG. 3 in response to instructions 304 conveyed to the system 100 by medium 302.

In some implementations, signal bearing medium 302 may encompass a computer-readable medium 306, such as, but not limited to, a hard disk drive, a Compact Disc (CD), a Digital Video Disk (DVD), a digital tape, memory, etc. In some implementations, signal bearing medium 302 may encompass a recordable medium 308, such as, but not limited to, memory, read/write (R/W) CDs, R/W DVDs, etc. In some implementations, signal bearing medium 302 may encompass a communications medium 310, such as, but not limited to, a digital and/or an analog communication medium (e.g., a fiber optic cable, a waveguide, a wired communications link, a wireless communication link, etc.). Thus, for example, program product 300 may be conveyed to one or more modules of the system 100 by an RF signal bearing medium 302, where the signal bearing medium 302 is conveyed by a wireless communications medium 310 (e.g., a wireless communications medium conforming with the IEEE 802.11 standard).

Figure 4:
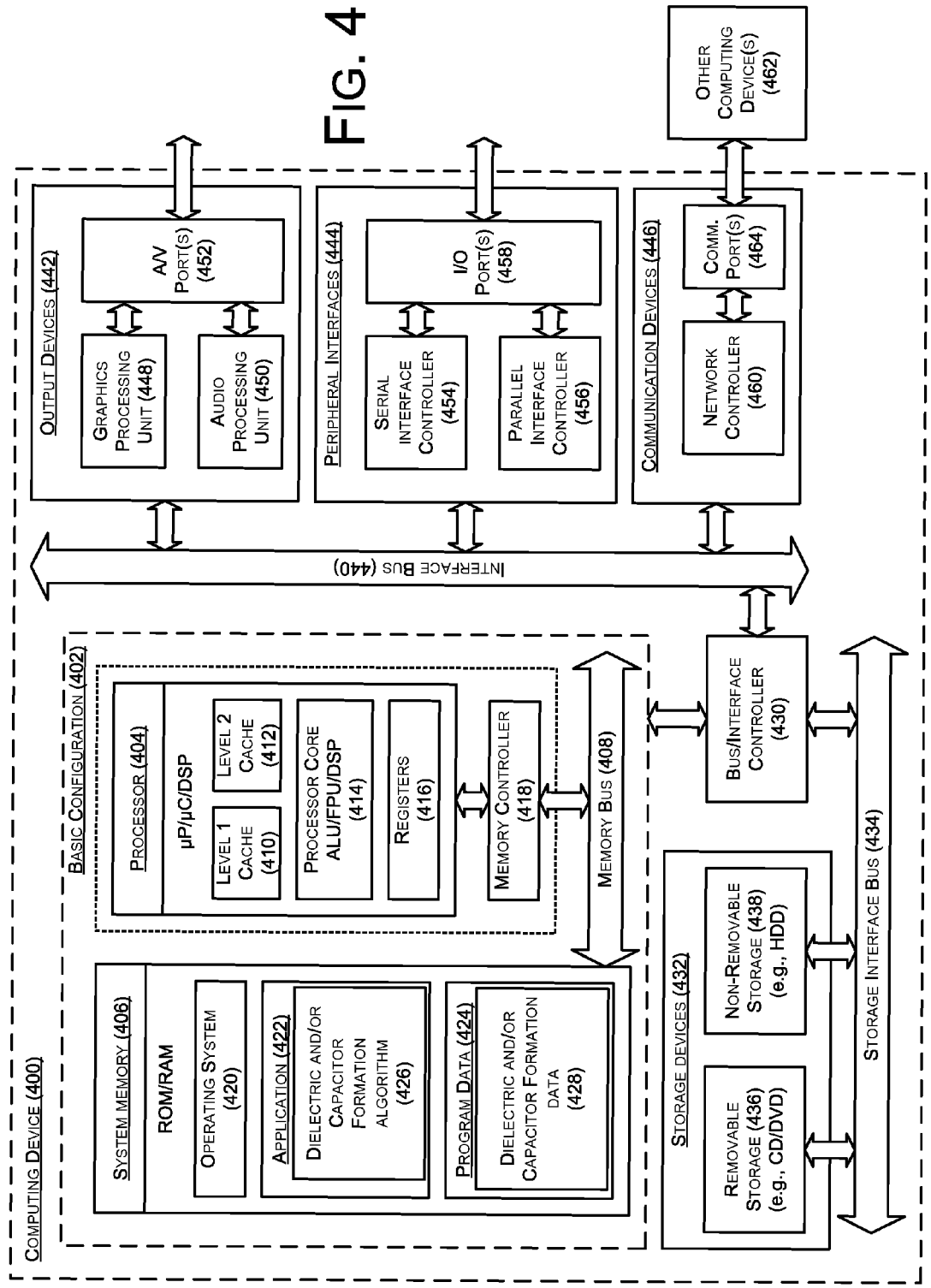
FIG. 4 is a block diagram illustrating an example computing device that is arranged to implement dielectric and/or capacitor formation.

FIG. 4 is a block diagram illustrating an example computing device that is arranged to implement dielectric and/or capacitor formation according to at least some embodiments described herein. In a very basic configuration 402, computing device 400 typically includes one or more processors 404 and a system memory 406. A memory bus 408 may be used for communicating between processor 404 and system memory 406.

Depending on the desired configuration, processor 404 may be of any type including but not limited to a microprocessor (μP), a microcontroller (μC), a digital signal processor (DSP), or any combination thereof. Processor 404 may include one more levels of caching, such as a level one cache 410 and a level two cache 412, a processor core 414, and registers 416. An example processor core 414 may include an arithmetic logic unit (ALU), a floating point unit (FPU), a digital signal processing core (DSP Core), or any combination thereof. An example memory controller 418 may also be used with processor 404, or in some implementations memory controller 418 may be an internal part of processor 404.

Depending on the desired configuration, system memory 406 may be of any type including but not limited to volatile memory (such as RAM), non-volatile memory (such as ROM, flash memory, etc.) or any combination thereof. System memory 406 may include an operating system 420, one or more applications 422, and program data 424. Application 422 may include a dielectric and/or capacitor formation algorithm 426 that is arranged to perform the various functions/actions/operations as described herein including at least those described with respect to system 100 of FIGS. 1-3. Program data 424 may include dielectric and/or capacitor formation data 428 that may be useful for implementing dielectric and/or capacitor formation as is described herein. In some embodiments, application 422 may be arranged to operate with program data 424 on operating system 420 such that dielectric and/or capacitor formation may be provided. This described basic configuration 402 is illustrated in FIG. 4 by those components within the inner dashed line.

Computing device 400 may have additional features or functionality, and additional interfaces to facilitate communications between basic configuration 402 and any required devices and interfaces. For example, a bus/interface controller 430 may be used to facilitate communications between basic configuration 402 and one or more data storage devices 432 via a storage interface bus 434. Data storage devices 432 may be removable storage devices 436, non-removable storage devices 438, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media may include volatile and nonvolatile, removable and non-removable media implemented in any method or technology for storage of information, such as computer readable instructions, data structures, program modules, or other data.

System memory 406, removable storage devices 436 and non-removable storage devices 438 are examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which may be used to store the desired information and which may be accessed by computing device 400. Any such computer storage media may be part of computing device 400.

Computing device 400 may also include an interface bus 440 for facilitating communication from various interface devices (e.g., output devices 442, peripheral interfaces 444, and communication devices 446) to basic configuration 402 via bus/interface controller 430. Example output devices 442 include a graphics processing unit 448 and an audio processing unit 450, which may be configured to communicate to various external devices such as a display or speakers via one or more A/V ports 452. Example peripheral interfaces 444 include a serial interface controller 454 or a parallel interface controller 456, which may be configured to communicate with external devices such as input devices (e.g., keyboard, mouse, pen, voice input device, touch input device, etc.) or other peripheral devices (e.g., printer, scanner, etc.) via one or more I/O ports 458. An example communication device 446 includes a network controller 460, which may be arranged to facilitate communications with one or more other computing devices 462 over a network communication link via one or more communication ports 464.

The network communication link may be one example of a communication media. Communication media may typically be embodied by computer readable instructions, data structures, program modules, or other data in a modulated data signal, such as a carrier wave or other transport mechanism, and may include any information delivery media. A "modulated data signal" may be a signal that has one or more of its characteristics set or changed in such a manner as to encode information in the signal. By way of example, and not limitation, communication media may include wired media such as a wired network or direct-wired connection, and wireless media such as acoustic, radio frequency (RF), microwave, infrared (IR) and other wireless media. The term computer readable media as used herein may include both storage media and communication media.

Computing device 400 may be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 400 may also be implemented as a personal computer including both laptop computer and non-laptop computer configurations.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of forming a capacitor, the method comprising:
    placing a first layer on a support, wherein the first layer includes aluminum;
    oxidizing at least a part of the first layer to form a second layer on the first layer, the second layer including $Al_2O_3$;
    placing a third layer on the second layer, the third layer includes tellurium and oxygen;
    and placing a fourth layer on the third layer, wherein the fourth layer includes tin and tellurium to form the capacitor.

2. The method as recited in claim 1, wherein:
    the third layer includes at least one of $Te_2O_5$, $TeO_2$ or $TeO_3$; and
    the fourth layer includes SnTe.

3. The method as recited in claim 1, wherein:
    the third layer includes $Te_2O_5$ with a thickness of about 5 nm; and
    the fourth layer includes SnTe with a thickness of about 20 nm.

4. The method as recited in claim 1, wherein:
    the third layer includes $Te_2O_5$ with a thickness in a range from about 1 nm to about 10 nm; and
    the fourth layer includes SnTe with a thickness in a range of about 1 nm to about 50 nm.

5. The method as recited in claim 1, wherein placing the fourth layer on the third layer comprises:
    placing a fifth layer including tellurium on the third layer;
    placing a sixth layer including tin on the fifth layer;
    placing a seventh layer including tellurium on the sixth layer; and
    annealing the fifth, sixth, and seventh layers to form the fourth layer.

6. The method as recited in claim 1, wherein placing the fourth layer on the third layer comprises:

placing a fifth layer including tellurium on the third layer, wherein the fifth layer has a thickness in a range from about 5 nm to about 7 nm;

placing a sixth layer including tin on the fifth layer, wherein the sixth layer has a thickness in a range of about 7 nm to about 9 nm;

placing a seventh layer including tellurium on the sixth layer, wherein the seventh layer has a thickness in a range from about 5 nm to about 7 nm; and annealing the fifth, sixth and seventh layers to form the fourth layer.

7. The method as recited in claim 1, further comprising:
placing a fifth layer on the fourth layer, wherein the fifth layer includes tellurium and oxygen; and
wherein placing the fourth layer on the third layer comprises:
placing a sixth layer including tellurium on the third layer;
placing a seventh layer including tin on the sixth layer;
placing an eighth layer including tellurium on the seventh layer; and
annealing the sixth, seventh and eighth layers to form the fourth layer.

8. The method as recited in claim 1, wherein the support is a first support and the method further comprises:
placing a fifth layer on the fourth layer, wherein the fifth layer includes tellurium and oxygen;
wherein placing the fourth layer on the third layer comprises:
placing a sixth layer including tellurium on the third layer;
placing a seventh layer including tin on the sixth layer;
placing an eighth layer including tellurium on the seventh layer;
annealing the sixth, seventh, and eighth layers to form the fourth layer; and the method further comprises:
placing a ninth layer including a second conductive material on a second support;
placing a tenth layer including the second conductive material and oxygen on the ninth layer;
placing an eleventh layer on the tenth layer, wherein the eleventh layer includes tellurium and oxygen;
placing a twelfth layer on the eleventh layer, wherein the twelfth layer includes tin and tellurium;
placing a thirteenth layer on the twelfth layer, wherein the thirteenth layer includes tellurium and oxygen;
wherein placing the twelfth layer on the eleventh layer comprises:
placing a fourteenth layer including tellurium on the eleventh layer;
placing a fifteenth layer including tin on the fourteenth layer;
placing a sixteenth layer including tellurium on the fifteenth layer;
annealing the fourteenth, fifteenth, and sixteenth layers to form the twelfth layer; and
the method further comprises placing the thirteenth layer on the fifth layer.

9. A method of forming a component, the method comprising:

forming a first electrode on a support;
forming a dielectric structure on the first electrode; and
forming a second electrode on the dielectric structure to form the component, wherein the component is a capacitor, and forming the dielectric structure further comprises:
forming a first layer comprising tellurium and oxygen, wherein the first layer is formed on the first electrode; and
forming a second layer comprising tellurium and tin, wherein the second layer is formed on the first layer.

10. The method of claim 9, wherein forming the first layer comprising tellurium and oxygen comprises forming the first layer comprising at least one of $Te_2O_5$, $TeO_2$ or $TeO_3$.

11. The method of claim 9, wherein forming the second layer comprising tellurium and tin comprises forming the second layer comprising SnTe.

12. The method of claim 9, wherein the first electrode comprises aluminum, the method further comprising oxidizing the aluminum to form an $Al_2O_3$ layer on the first electrode, wherein the first layer is formed on the $Al_2O_3$ layer.

13. A method of forming a component, the method comprising:
forming a first electrode on a support;
forming a dielectric structure on the first electrode; and
forming a second electrode on the dielectric structure to form the component, wherein the component is a capacitor, and forming the dielectric structure further comprises:
forming a first layer comprising tellurium and oxygen, wherein the first layer comprises at least one of $Te_2O_5$, $TeO_2$ or $TeO_3$; and
forming a second layer comprising tellurium and tin, wherein the second layer comprises SnTe.

14. The method of claim 13, further comprising:
forming a first plurality of layers, each layer of the first plurality of layers comprising at least one of $Te_2O_5$, $TeO_2$ or $TeO_3$, the first plurality of layers including the first layer; and
forming a second plurality of layers, each layer of the second plurality of layers comprising SnTe, the second plurality of layers including the second layer, wherein each layer of the second plurality of layers is located between a pair of layers of the first plurality of layers.

15. A method of forming a capacitor, the method comprising:
placing a first electrode on a support;
placing a first layer on the first electrode, wherein the first layer includes tellurium and oxygen;
placing a second layer on the first layer wherein the second layer includes tin and tellurium; and
placing a second electrode on the second layer to form the capacitor.

16. The method as recited in claim 15, wherein:
the first layer includes at least one of $Te_2O_5$, $TeO_2$ or $TeO_3$; and
the second layer includes SnTe.

* * * * *

UNITED STATES PATENT AND TRADEMARK OFFICE
CERTIFICATE OF CORRECTION

PATENT NO. : 9,230,797 B2
APPLICATION NO. : 13/391038
DATED : January 5, 2016
INVENTOR(S) : Rothfuss et al.

Page 1 of 1

It is certified that error appears in the above-identified patent and that said Letters Patent is hereby corrected as shown below:

On the Title Page, in Item (74), under "Attorney, Agent, or Firm", in Column 2, Line 1, delete "Morritt" and insert -- Moritt --, therefor.

IN THE SPECIFICATION

In Column 1, Line 4, delete "CROSS REFERENCE" and insert -- CROSS-REFERENCE --, therefor.

In Column 1, Line 8, delete "§371" and insert -- § 371 --, therefor.

In Column 2, Line 21, delete "hereof In" and insert -- hereof. In --, therefor.

In Column 5, Line 15, delete "cr is" and insert -- εr is --, therefor.

Signed and Sealed this
Thirty-first Day of May, 2016

Michelle K. Lee
*Director of the United States Patent and Trademark Office*